(12) United States Patent
Birk

(10) Patent No.: US 7,687,135 B2
(45) Date of Patent: Mar. 30, 2010

(54) LABEL FOR COVERING GAS EXCHANGE OPENINGS

(75) Inventor: Uwe Birk, Munich (DE)

(73) Assignee: Schreiner Group GmbH & Co., KG (DE)

( * ) Notice: Subject to any disclaimer, the term of this patent is extended or adjusted under 35 U.S.C. 154(b) by 145 days.

(21) Appl. No.: 11/209,046

(22) Filed: Aug. 23, 2005

(65) Prior Publication Data

US 2006/0040092 A1 Feb. 23, 2006

(30) Foreign Application Priority Data

Aug. 23, 2004 (EP) .................................. 04104042

(51) Int. Cl.
*B32B 9/00* (2006.01)
*B32B 33/00* (2006.01)
*B32B 7/12* (2006.01)
*B32B 15/04* (2006.01)
*B32B 3/20* (2006.01)
*B42D 15/10* (2006.01)

(52) U.S. Cl. ..................... 428/188; 428/40.1; 428/42.1; 428/343; 428/354; 283/81

(58) Field of Classification Search ................ 428/188, 428/167, 40.1, 42.1, 343, 354; 283/81
See application file for complete search history.

(56) References Cited

U.S. PATENT DOCUMENTS

| 4,724,961 A * | 2/1988 | Shimoyamada et al. ..... 206/439 |
| 6,182,850 B1 | 2/2001 | Marbler et al. |
| 6,482,287 B1 * | 11/2002 | De Gaulle .................... 156/245 |
| 6,506,110 B1 | 1/2003 | Borisch |
| 6,524,675 B1 * | 2/2003 | Mikami et al. ............. 428/40.1 |
| 2003/0064190 A1 * | 4/2003 | Carte et al. ................ 428/40.1 |

FOREIGN PATENT DOCUMENTS

| DE | 196 53 890 | 6/1998 |
| DE | 19653890 A1 * | 6/1998 |
| EP | 0 024 310 | 3/1981 |
| EP | 160978 A2 * | 11/1985 |
| EP | 1 340 695 | 9/2003 |
| GB | 1 583 503 | 1/1981 |
| WO | WO 99/29150 | 6/1999 |

* cited by examiner

*Primary Examiner*—David R Sample
*Assistant Examiner*—Catherine Simone
(74) *Attorney, Agent, or Firm*—Studebaker & Brackett PC; Donald R. Studebaker

(57) ABSTRACT

The top label is equipped with an inscription in the form of a barcode and a model number. A recess, which continues in two channels also implemented in the bottom label, is provided in the bottom label where the gas exchange opening is located when the label is used as intended. The top label covers the channel system. The channels discharge into the surroundings at the label edge, so that two gas passage openings are defined by the intersection region between label contour and the contours of the channel system. Liquid may drain out of the channel system in many different spatial orientations of the housing which the label is stuck onto as intended. A gas permeable membrane may advantageously be positioned in the region of the recess and extending somewhat over it. The membrane may also extend over the entire bottom of the label. If the membrane is implemented as self-adhesive on the bottom, it must then be largely free of adhesive in the region of the gas exchange opening in order to ensure its gas permeability.

13 Claims, 3 Drawing Sheets

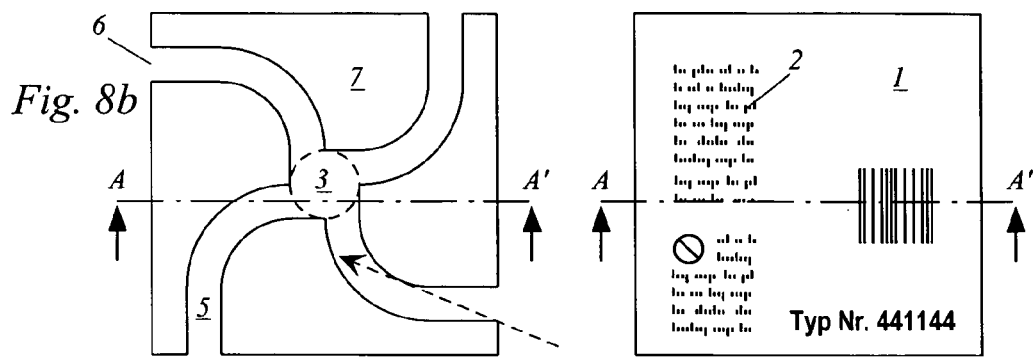
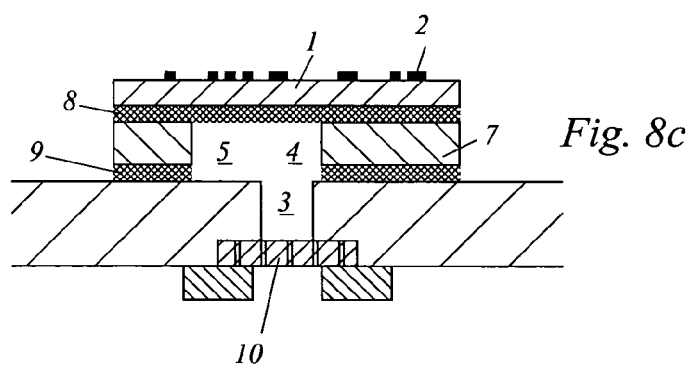
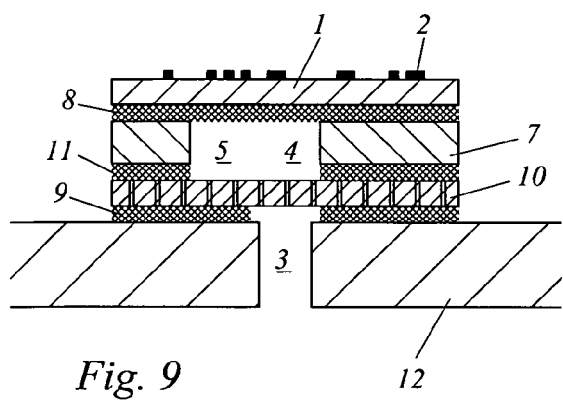
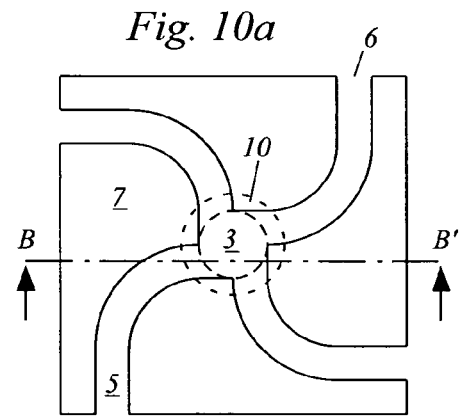
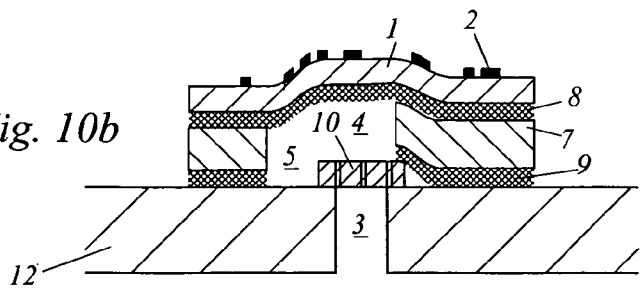

LABEL FOR COVERING GAS EXCHANGE OPENINGS

TECHNICAL FIELD OF THE INVENTION

The present invention relates to a label for covering gas exchange openings.

BACKGROUND OF THE INVENTION

Electronic control units are frequently used in dusty, damp, or corrosive surroundings, for example, in automobile construction or in industrial apparatus and machines. In addition, they may sometimes be subjected to mechanical strains, such as impact or shock strains. In order to ensure the function of the included electronic components, the control units are therefore installed in closed housings. The latter must be sealed against the cited damaging influences, however, it is typically necessary to provide pressure equalization openings which permit a gas exchange with the surroundings. In particular, in the event of falling ambient temperature, it must be ensured that water molecules from the air contained in the housing interior may diffuse to the outside in order to avoid harmful condensation in the device.

In order to nonetheless avoid the penetration of liquid water and dust, the gas exchange openings, which are used for pressure equalization and/or vapor pressure equalization, are sometimes closed by gas-permeable membranes. Corresponding membranes may also be provided as self-adhesive labels or parts thereof in order to allow easy attachment. A label of this type is known, for example, from German Published Application DE 196 53 890 A1.

Frequently, however, it is not sufficient to merely cover a gas exchange opening with a membrane, because typical membranes only offer limited protection against the passage of liquids. Thus, for example, water passes through most commercially available membranes if the jet of a high-pressure cleaner is directed thereon. This is not unusual in practice, for example, in control units of construction machinery or electronic devices in industrial technology. Furthermore, exposed membranes may become leaky due to mechanical wear.

Attaching a gas exchange opening, which has a gas membrane stuck over it, in a depression of a housing wall and sticking a protective sticker over the depression is known from WO 99/29150 A 1. The gas exchange remains ensured because recesses are provided in the housing wall, originating from the depression, which are only partially covered by the sticker. However, an arrangement of this type is relatively complex since the depression and recesses must be produced through appropriate shaping and/or machining of the housing wall. In addition, if self-adhesive membranes are used, the problem arises that they may be dispensed into the depression by machines only with difficulty or not at all, so that typically they must be stuck on by hand.

SUMMARY OF THE INVENTION

In consideration of the problems described, the present invention is based on the object of providing a possibility for covering gas exchange openings, which may be implemented cost-effectively and is usable flexibly and which additionally offers high protection against directly incident liquid jets and against wear.

According to one aspect of the present invention, this object is achieved by a self-adhesive label adhered to a housing of an electrical or electronic device, thereby covering a gas exchange opening disposed in the housing, comprising a top label and a bottom label, which has a channel system comprising channels and a shared recess wherein each of the channels discharges into the shared recess. Preferred embodiments of the present invention may be implemented according to one of the several figures.

According to a further aspect of the present invention, this object is achieved by a method for manufacturing labels comprising the steps of: (a) providing a bottom label material web on a carrier web, the carrier web being coated so that it repels adhesive, (b) stamping the channel structures forming a self-repeating, coherent pattern, (c) pulling off bottom label material which fills the channel structures as a lattice, and (d) applying top label material which covers the channel structure. Preferred embodiments of the method may be implemented according to one of the several figures.

In principle, any variation of the present invention described and/or indicated in the framework of the present application may be especially advantageous, depending on the economic and technical conditions in the specific case. If not otherwise indicated and/or if technically possible in principle, individual features of the embodiment described may be exchanged and/or combined with one another.

A label designed according to the present invention is stuck over a gas exchange opening in such a way that this opening is connected to the gas passage opening provided in the label via the bottom of the channel system, which is permeable to gas. The gas exchange opening may thus be implemented as a simple hole in the housing or the like and is nonetheless securely covered by the top label, without the pressure equalization and/or vapor exchange function being impaired. Special constructive measures in the housing wall are not necessary. Thus, pressure equalization openings of housings which were not originally constructed in consideration of special resistance to directly incident liquid jets may be equipped appropriately later.

With the preferably provided self-adhesive embodiment of the label, it may be applied automatically without problems. In principle, all adhesives typical in the field of label technology come into consideration for a corresponding self-adhesive coating, depending on the housing material and the strain to be expected. Alternatively, other attachment possibilities also come into consideration.

Typical films or film composites, which may be selected as a function of the wear strain to be expected, may be used as the material for the top label. If the label is also to fulfill an identification function, for example, as a nameplate or warning sticker, a laser-writable film composite, which is known per se, may be provided for the top label. In addition or alternatively, the top label may also, however, the provided with an imprint. Other functions may also be assumed by the top label, for example, it may be equipped with a security feature against forgeries, such as a hologram, microprinting, etc.

The bottom label may also be implemented as single-layer or multilayered. Above all, multiple plastic materials come into consideration as the materials. The thickness of the bottom label determines the height of the channels and may be selected as a function of the required gas throughput and the width of the channels provided in the bottom label. If the entrance of foreign bodies, particularly large ones, into the channels is to be avoided, a lower thickness of the bottom label and thus a lower channel height may be selected. In principle, the present invention may be implemented in a broad spectrum of different dimensions and dimension ratios.

Gas passage openings may be designed differently as the connection between the channel and the surroundings. Thus, channels according to the present invention may be guided up to the label edge and discharge there into the surrounding atmosphere. Alternatively, gas passage openings may also be provided in the top label.

Channels in the bottom label may have kinks or bends in order to avoid the penetration of foreign bodies into the gas exchange opening or to increase the pressure drop of flowing liquid if a liquid jet or wave hits a gas passage opening directly. If multiple channels which are connected to one another are each provided with their own gas passage opening, it is possible to position them in such a way that liquid may drain out of the channel system in almost any arbitrary orientation of the label. It is frequently especially favorable in this case to position at least three channels in a star shape and attach the label in such a way that the gas exchange opening to be covered lies at the location at which the channels meet one another. For special sealing tasks, channels may be guided in a labyrinth in the bottom label.

Labels according to the present invention are also suitable for covering gas exchange openings which have already been closed by a gas permeable membrane. Alternatively, according to a preferred refinement of the present invention, the label itself may have a membrane as a layer provided over part or all of the surface below the bottom label. However, applications without a membrane are also conceivable, for example, if the label is only used as a sprayed water protector and the orientation in relation to gravity is predefined.

Of course, a label according to the present invention may also be designed so that it covers multiple openings.

The channel structures in the bottom label advantageously may be produced in such a way that the channel contours are first stamped into continuous bottom label material which is provided on a carrier material, and the bottom layer material is then pulled out of the interior of the channels as a lattice. Top label material may then be laminated over this and the label contour may be stamped. Alternatively, top labels may also be dispensed individually.

In the following, examples of preferred embodiments of the present invention will be explained in greater detail on the basis of the attached drawing. The figures of the drawing are purely schematic illustrations which are not to scale, in particular, in sectional illustrations of the labels, layer thicknesses are enlarged greatly for reasons of visibility. Elements corresponding to one another are each provided with the same reference numbers in the individual figures.

BRIEF DESCRIPTION OF THE DRAWINGS

FIG. 8a shows the top label of a further label implemented as a nameplate in a top view.

FIG. 8b shows the bottom label belonging to the top label from FIG. 8a in a top view, the preferred position of the gas exchange opening to be covered again being indicated as a dashed circle.

FIG. 8c shows a sectional illustration of the label from FIGS. 8a, b, positioned as intended on a housing part, in the sectional plane indicated by the dot-dash line A-A'.

FIG. 9 shows a sectional illustration, analogous to FIG. 8c, of a similarly constructed label which has a membrane as an additional label layer, however.

FIG. 10a shows an illustration, analogous to FIG. 8b, of the bottom label of a similarly constructed label, which, however, has a membrane in the region of the intended position of the gas exchange opening to be covered (again indicated by the inner dashed circle), the position of the membrane being indicated by the outer of the two dashed circles.

FIG. 10b shows a sectional illustration, analogous to FIG. 8c and FIG. 9, of the label illustrated in FIG. 10a in the sectional plane indicated by the dot-dash line B-B'.

DETAILED DESCRIPTION OF THE INVENTION

Figure 1:
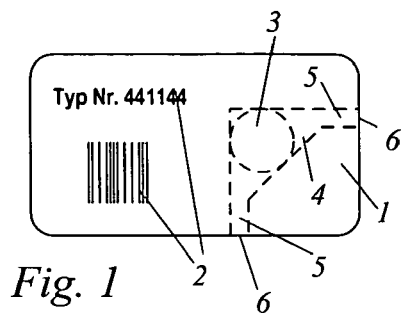
FIG. 1 shows a label according to the present invention, implemented as a nameplate having a bar code, in a top view, the preferred position of the gas exchange opening to be covered being indicated as a dashed circle and the channel structures provided in the bottom label, which extend up to the label edge, being indicated as dashed lines.

The top label 1 of the label shown in FIG. 1 is equipped with an inscription 2 in the form of a bar code and a model number. The inscription 2 may be printed, or is produced using laser inscription. A laser-writable construction of the top label may be manufactured from an at least partially transparent cover film, a layer which may be laser ablated (such as a sputtered metal coating), and a contrast layer. The function of a contrast layer may also be assumed by the bottom label (covered in FIG. 1).

A recess 4, which continues in two channels 5, is provided in the bottom label where the gas exchange opening 3 is located when the label is used as intended. The channels 5 discharge into the surroundings at the label edge, so that two gas passage openings 6 are defined by the intersection region between label contours and the contours of the channel system. Because the channels 5 are oriented in two different directions, liquid may drain out of the channel system in many different spatial orientations of the housing onto which the label is stuck as intended. A gas-permeable membrane (not shown in FIG. 1) advantageously may be positioned in the region of the recess 4 and extending somewhat over it. The membrane may also extend over the entire bottom of the label. If the membrane is implemented as self-adhesive on the bottom, it must then be largely free of adhesive in the region of the gas exchange opening 3 in order to ensure its gas permeability.

Figure 2:
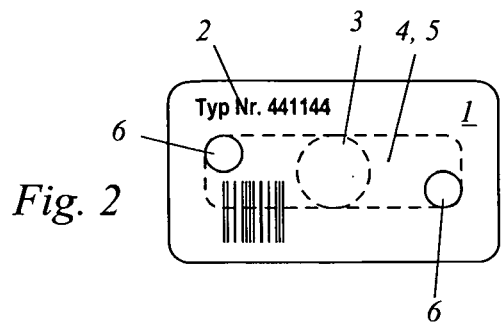
FIG. 2 also shows a label implemented as a nameplate having a bar code in a top view, the preferred position of the gas exchange opening to be covered again being indicated as a dashed circle and the channel structure provided in the bottom label being indicated as a dashed line, and, in contrast to FIG. 1, the gas passage openings provided in the label being implemented as stamps in the top label.

The label shown in FIG. 2 has a top label 1 designed as in FIG. 1. The recess 4 in the bottom label (covered in FIG. 2) is designed as a wider channel 5, which does not extend up to the label edge, in contrast to FIG. 2. A gas permeable membrane (not shown in FIG. 2) may again advantageously be positioned in the region of the recess 4 and extending somewhat over it. The membrane may also extend over the entire bottom of the label. If the membrane is implemented as self-adhesive on the bottom, it must then be largely free of adhesive in the region of the gas exchange opening 3 in order to ensure its gas permeability. The gas passage openings 6 are implemented as stamps in the top label 5. Because outlet openings 6 and gas exchange opening 3 are positioned somewhat offset to one another when the label is attached as intended, the latter opening is well protected, even if a high-pressure water jet is pointed directly at the label. The positioning of the gas exchange opening 6 in the top label is especially advantageous if the label is attached overhead, since liquid possibly located in the recess 4 of the bottom label may then drain off easily.

Figure 3A:
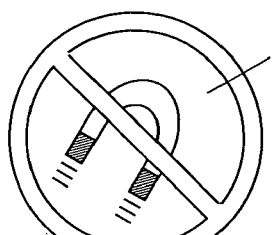
FIG. 3a shows the top label of a label implemented as a warning plate in a top view.
Figure 3B:
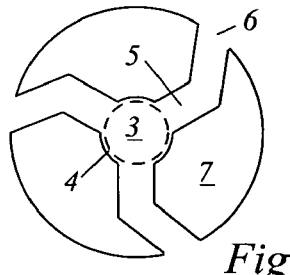
FIG. 3b shows the bottom label belonging to the top label from FIG. 3a in a top view, the preferred position of the gas exchange opening to be covered again being indicated as a dashed circle.

The top label 1 illustrated in FIG. 3a is implemented as a warning plate having a colored imprint. The associated bottom label 7 shown in FIG. 3b has three channels 5, connected to one another, which enclose an angle of approximately 120° with one another in each case. It is thus ensured that in almost any arbitrary orientation of the label in space, liquid possibly located in the channel system may drain off through the gas passage openings 6, which are again located where the channels 5 extend to the label edge. The gas exchange opening 3 to be covered by the label is advantageously again closed using a gas permeable membrane (not shown) which is preferably implemented as part of the label and may extend over all or a part of the label bottom. The channels 5 have a kink in the label plane. If a high-pressure liquid jet is incident next to the label, a liquid flow possibly entering the channel 5 experiences a significant pressure drop. Since typical semi-permeable membranes (i.e., membranes which are gas-permeable but water-impermeable under normal conditions) become liquid-permeable from a certain minimum liquid pressure, these still fulfill their purpose under environmental conditions where they would have already failed without covering according to the present invention.

FIGS. 4b, 5b, 6b, and 7b each show alternative designs of bottom labels 7 having different arrangements of the channels 5. The channels 5 are each directed in different spatial directions in order to allow the drainage of liquid in different orientations of the label. The channels 5 each discharge into a shared central recess 4, where the gas exchange opening 3 to be covered is located when the label is attached as intended. This opening is again advantageously covered by a semi-permeable membrane (not shown) as defined above, which is preferably implemented as part of the label and may extend over all or a part of the label bottom. The gas passage openings 6 are again located where the channels 5 extend to the label edge.

Figure 5A:
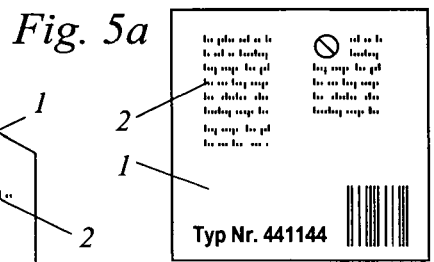
FIG. 5a shows the top label of a label implemented as a nameplate in a top view.
Figure 5B:
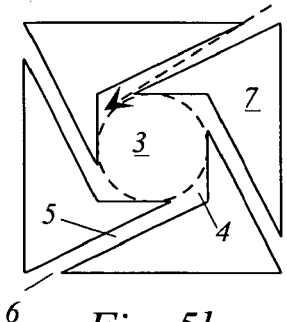
FIG. 5b shows the bottom label belonging to the top label from FIG. 5a in a top view, the preferred position of the gas exchange opening to be covered again being indicated as a dashed circle.
Figure 7A:
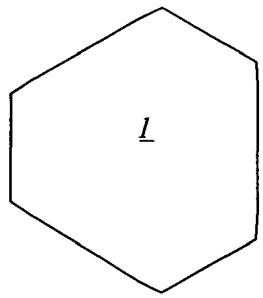
FIG. 7a shows the top label of a further label in a top view.

Through different measures, in the examples shown, the penetration of liquid to the gas exchange opening 3 is made more difficult, and/or the pressure drop in a possibly entering liquid stream is elevated in order to relieve the membrane. In FIG. 5b, the channels 5 are implemented relatively narrow and meet a corner region of the central recess 4 diagonally. As may be seen on the basis of the dashed arrow, even a sharp liquid jet entering diagonally through a gas passage opening 6 may not hit the gas exchange opening 3 directly.

Figure 6A:
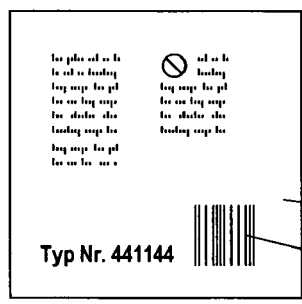
FIG. 6a shows the top label of a further label implemented as a nameplate in a top view.
Figure 6B:
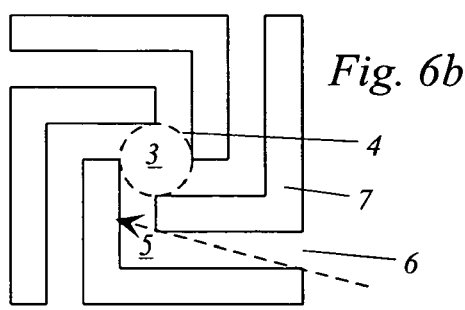
FIG. 6b shows the bottom label belonging to the top label from FIG. 6a in a top view, the preferred position of the gas exchange opening to be covered again being indicated as a dashed circle.
Figure 7B:
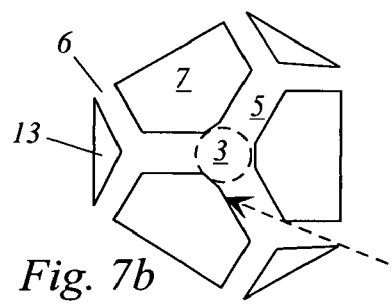
FIG. 7b shows the bottom label belonging to the top label from FIG. 7a in a top view, the preferred position of the gas exchange opening to be covered again being indicated as a dashed circle.

In FIG. 6b, the channels 5 are implemented very long and bend by 90°. It may also be seen here on the basis of the dashed arrow that even a sharp liquid jet entering diagonally through a gas passage opening 6 may not hit the gas exchange opening 3 directly. This is also true for the bottom label 1 shown in FIG. 7b, in which the particular discharge of the channels 5 into the surroundings has a type of impact projector 13, which projects from diagonally incident sharp liquid jets or foreign bodies.

In FIG. 8b, the relatively long and narrow channels 5 have a bend which is used for the same purpose.

Figure 4A:
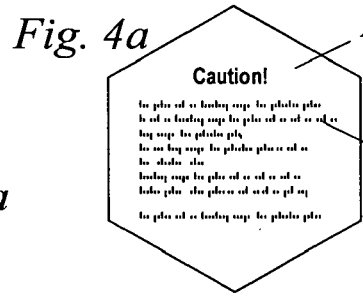
FIG. 4a shows the top label of a label implemented as a warning plate in a top view.
Figure 4B:
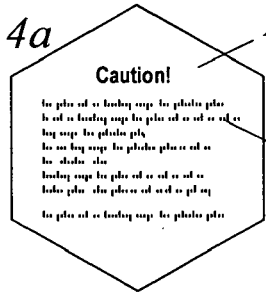
FIG. 4b shows the bottom label belonging to the top label from FIG. 4a in a top view, the preferred position of the gas exchange opening to be covered again being indicated as a dashed circle.

The particular associated top labels 1 are shown in FIGS. 4a, 5a, 6a, 7a, and 8a. In FIG. 4a, the top label is implemented as a warning plate, and as a nameplate in FIGS. 5a, 6a, and 8a. As is obvious on the basis of all top labels 1 shown, the achievement of the object according to the present invention offers a large palette of possible embodiments for expedient product design. The shapes of the labels usually do not have to be tailored exactly to predefined housing geometries, particularly if they are implemented as self-adhesive. It is typically sufficient if the label is not too large in comparison to the housing dimensions and the channel system of the label is not implemented too small in relation to the gas exchange opening 3 to be covered.

FIG. 8c shows a section through the label shown in FIGS. 8a and 8b along the second line A-A', after it was stuck on as intended over a gas exchange opening 3 of a housing of an electrical or electronic device using a bottom adhesive coating 9. The housing wall 12 is only shown in detail. In the variation shown, the gas exchange opening 3 is already provided with the membrane 10, so that the label may be implemented without a membrane. Top label 1 and bottom label 7 are glued to one another via the adhesive layer 8.

In the variation also shown in a sectional illustration in FIG. 9, a gas-permeable, hydrophobized membrane 10 is part of the label. It is coated with pressure-sensitive adhesive 9 on the bottom except in the region of the gas exchange opening 3 and glued on top to the bottom label 7 via the adhesive coating 11. This arrangement has the advantage that membrane 10 and its cover may be attached in one work step.

A similar variation is shown in FIGS. 10a and 10b, the membrane 10 not extending over the entire bottom of the label. The label thus adheres already to the housing wall 12 because of the bottom pressure-sensitive adhesive coating 9 of the bottom label 7. The membrane 10 itself does not have to be self-adhesive. This arrangement has the advantage that membrane material is saved in relation to the variation shown in FIG. 9.

Figure 11A:
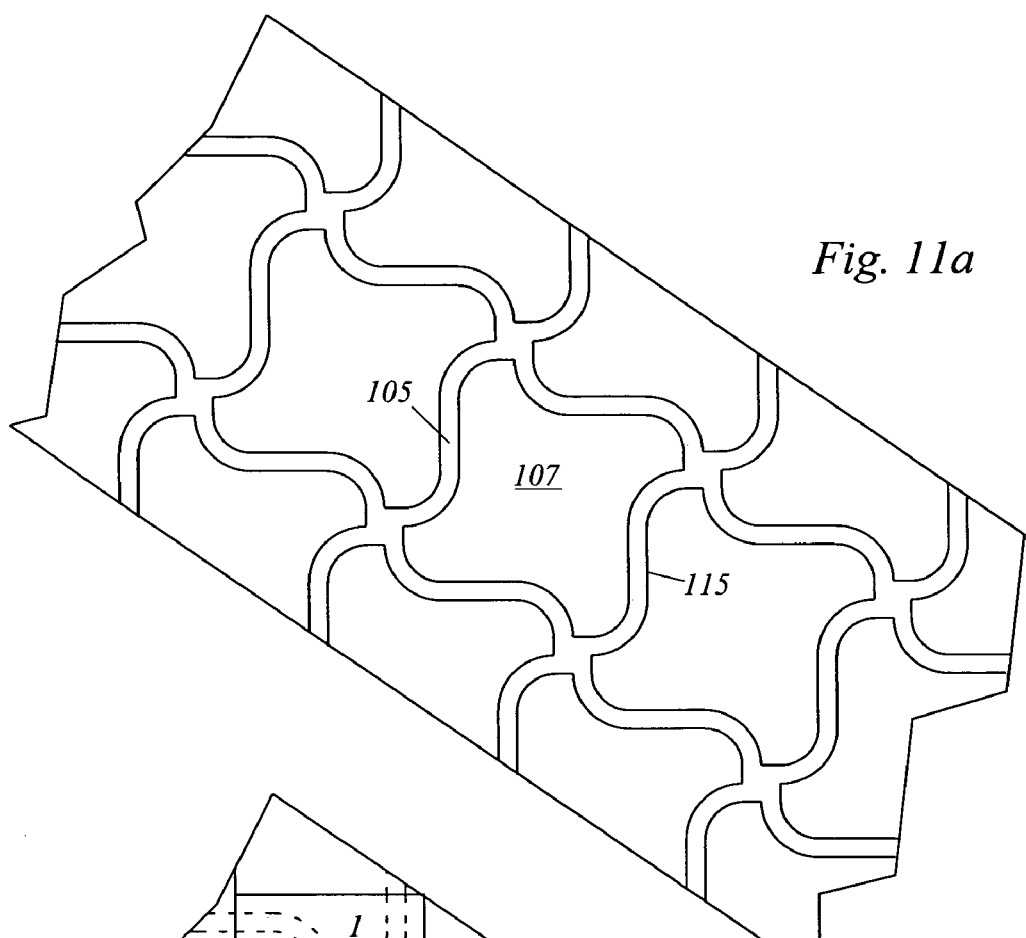
FIG. 11a shows a detail of a bottom label material web having the stamping lines of the channel contours for producing labels of the type illustrated in FIGS. 8a-c, 9, and 10a-b.
Figure 11B:
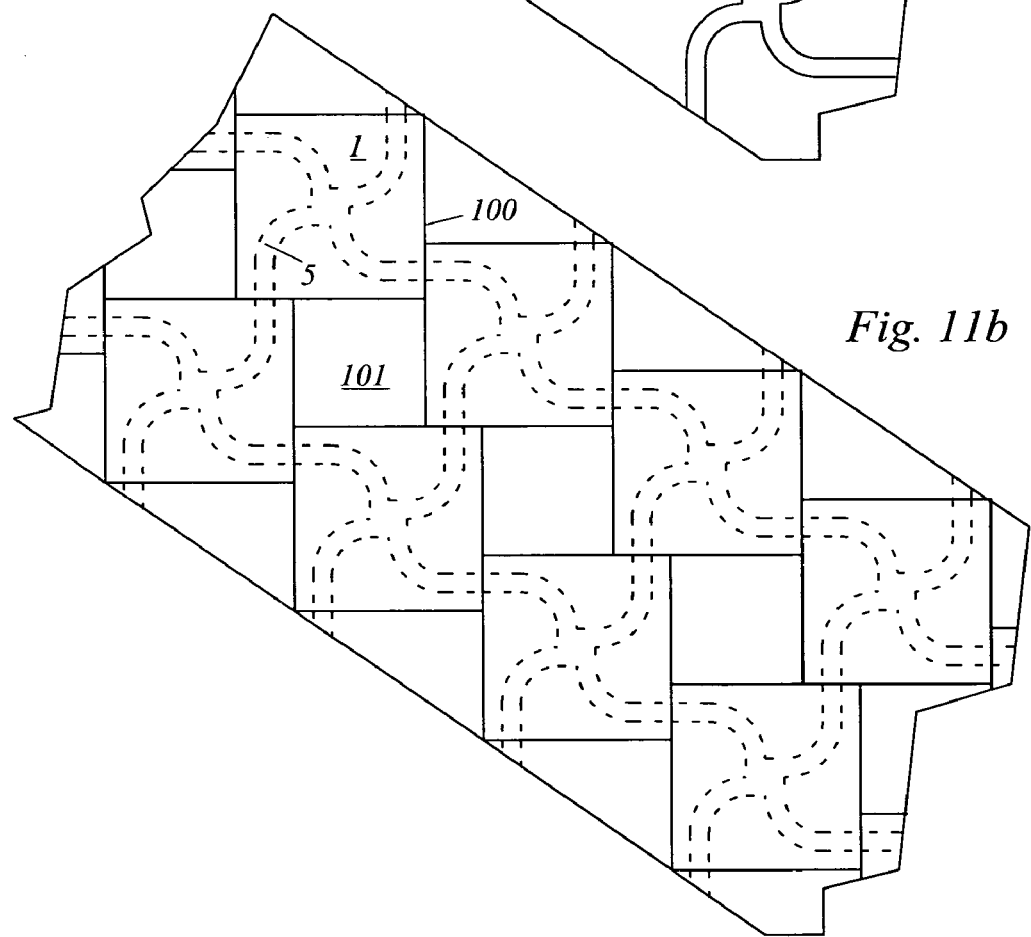
FIG. 11b shows the same detail as a FIG. 11a after pulling off the lattice, laminating over a top label material web, and stamping the label contours, the stamping lines in the bottom label material web being indicated by dashed lines.

FIGS. 11a and 11b illustrate the production of the channel structures according to the present invention. The contours 115 of the channels 5 are stamped into a bottom label material web 107, which is coated with pressure-sensitive adhesive and positioned on a carrier web coated to repel adhesive, and the resulting lattice 105 is pulled off. Subsequently, a top label material web 101, which is also coated with pressure-sensitive adhesive on the bottom, is laminated on top. The label contours 100 are stamped. If the labels are to have a membrane 10 on the bottom as shown in FIG. 9, a web made of membrane material is laminated on the bottom before this stamping procedure. For the production of labels of the type shown in FIGS. 10*a-b*, the membranes 10 may be dispensed onto the self-adhesive coated bottom of the bottom label material web after the lattice is pulled off.

What is claimed is:

1. A self-adhesive label adhered to a housing of an electrical or electronic device, thereby covering a gas exchange opening disposed in said housing, comprising:
    a top label; and
    a bottom label, which has a channel system comprising channels and a shared recess wherein each of the channels discharges into the shared recess;
    wherein the channel system is permeable to gas on its bottom in an area where the label covers the gas exchange opening and the channel system is connected to at least one gas passage opening provided in the label, said gas passage opening being positioned offset to said gas exchange opening.

2. The label according to claim 1, wherein the channels are kinked or curved in the plane of the bottom label.

3. The label according to claim 1, wherein at least three channels are provided.

4. The label according to claim 3, wherein the largest angle enclosed between two neighboring channels in the plane of the bottom label is smaller than 180°.

5. The label according to claim 1, which also has a gas permeable membrane.

6. The label according to claim 5, wherein the membrane is hydrophobic or hydrophobized.

7. The self-adhesive label according to claim 1, wherein the bottom label has a thickness of at least 0.3 mm.

8. The self-adhesive label according to claim 7, wherein the bottom label has a thickness of at least 0.6 mm.

9. The self-adhesive label according to claim 1, wherein the bottom label has a thickness of at most 1 mm.

10. The self-adhesive label according to claim 1, wherein the top label is printed with at least one of text information, image information and code information.

11. The self-adhesive label according to claim 1, wherein the top label is multilayered.

12. The self-adhesive label according to claim 11, wherein the top label is laser-writable.

13. The self-adhesive label according to claim 1, wherein the bottom label is multilayered.

* * * * *